(12) United States Patent
Koga

(10) Patent No.: US 6,538,260 B1
(45) Date of Patent: Mar. 25, 2003

(54) POSITION MEASURING METHOD, AND SEMICONDUCTOR DEVICE MANUFACTURING METHOD AND APPARATUS USING THE SAME

(75) Inventor: Shinichiro Koga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/533,690

(22) Filed: Mar. 23, 2000

(30) Foreign Application Priority Data

Mar. 26, 1999 (JP) .......................................... 11-084052

(51) Int. Cl.⁷ .............................................. G01B 11/00
(52) U.S. Cl. ....................................... 250/548; 356/401
(58) Field of Search ............................. 250/548, 559.3, 250/559.44; 356/399, 400, 401; 355/53, 54, 55

(56) References Cited

U.S. PATENT DOCUMENTS 5,543,921 A * 8/1996 Uzawa et al. ................ 250/548
5,986,766 A   11/1999 Koga et al. .................. 356/401

* cited by examiner

*Primary Examiner*—Kevin Pyo
(74) *Attorney, Agent, or Firm*—Fitzpatrick, Cella, Harper & Scinto

(57) ABSTRACT

A position measuring method for measuring a position of a mark formed on an object, includes detecting a mark waveform obtainable from the mark, acquiring a difference between the detected mark waveform and a reference waveform, correcting at least one of the mark waveform and the reference waveform on the basis of the acquired difference, and determining the position of the mark on the basis of (i) the corrected mark waveform and the reference waveform, (ii) the mark waveform and the corrected reference waveform, or (iii) the corrected waveform and the corrected reference waveform.

21 Claims, 6 Drawing Sheets

POSITION MEASURING METHOD, AND SEMICONDUCTOR DEVICE MANUFACTURING METHOD AND APPARATUS USING THE SAME

FIELD OF THE INVENTION AND RELATED ART

This invention relates to a position measuring method and a semiconductor exposure apparatus using the same. More particularly, the invention is concerned with a position measuring method and a semiconductor exposure apparatus using the same, which is particularly suitably applicable, for example, in a semiconductor exposure apparatus for projecting and printing an electronic circuit pattern onto a semiconductor substrate, to perform position measurement for an alignment mark of a wafer, to be used for precise alignment, or to perform relative alignment between a wafer and a mask, between a mask and a certain reference position in an apparatus, and between components in an apparatus, for example.

Precise position measurement for an article is used in various fields, such as work machines or robots, for example, and further improvements in its precision have been desired. As regards recent semiconductor devices, the degree of integration of each device is increasing more and more, as can be represented by DRAM, and the linewidth of a pattern to be formed on the semiconductor device is decreasing more and more. In these situations, in a process for measuring the relative position of a reticle and a wafer and for aligning them with each other, which process is an essential technique in a semiconductor exposure apparatus, a further improvement of precision is a critical matter.

A conventional semiconductor exposure apparatus as well as examples of conventional wafer alignment methods will be described below.

FIG. 2 is a schematic view of a semiconductor exposure apparatus. Denoted in the drawing at R is a reticle (original), and denoted at W is a wafer (substrate). Denoted at 1 is a projection optical system. Denoted at 2 is an alignment illumination means, and denoted at 3 is a beam splitter. Denoted at 4 and 5 are imaging optical systems. Denoted at 6 is an image pickup device, and denoted at 7 is an A/D (analog-to-digital) converter. Denoted at 8 is an integration device. Denoted at 10 is a stage driving means, and denoted at 11 is an X–Y stage which is movable two-dimensionally.

While in FIG. 2 only one alignment optical system G for X-direction measurement is illustrated, there is an additional alignment optical system (not shown) for performing Y-direction measurement, like the X-direction measurement. In the semiconductor exposure apparatus shown in FIG. 2, the relative position of the reticle R and the wafer W is detected, and then they are brought into alignment with each other. Thereafter, exposure light is projected from an exposure illumination light source (not shown), by which an electronic circuit pattern formed on the reticle R is projected and transferred to the wafer W, placed on the X–Y stage 11, through the projection optical system 1.

The mask-to-wafer alignment in the apparatus of FIG. 2 will be described below.

The alignment illumination device 2 emits non-exposure light (to which a resist is not sensitive). The light emitted from the illumination device 2 goes through the beam splitter 3, the reticle R and the projection optical system 1, and it illuminates an alignment mark formed on the wafer W. FIGS. 3A and 3B are schematic views for explaining the alignment mark, and it comprises plural rectangular patterns of the same shape. The light reflected by the alignment mark goes again through the projection optical system 1 and the reticle R, and it is reflected by the beam splitter 3. Then, after passing through the imaging optical system 5, it produces an image $W_M$ of the alignment mark upon the image pickup surface of the image pickup device 6. The image pickup device 6 then functions to photoelectrically convert the thus formed image $W_M$ of the mark, and a signal converted is applied to the A/D converter 7 where it is transformed into a two-dimensional digital signal array. The integration device 8 serves to set a processing window $W_P$ (FIG. 3B) to the wafer mark image as digitalized by the A/D converter 7. Further, the integration device 8 operates to perform integration processing in the window $W_P$ along the Y direction, to transform the two-dimensional imagewise signal into a one-dimensional mark waveform $S(x)$ such as shown in FIG. 3A. The position measuring device 9 in FIG. 2 serve to measure the position of the alignment mark, on the basis of the one-dimensional waveform $S(x)$ as outputted from the integration device 8.

The procedure described above is repeated, by which positional information is produced in relation to plural measurement points. On the basis of this positional information as well as information related to the relative position of the reticle R and the image pickup device 6, having been detected beforehand, the stage driving means 10 moves the X–Y stage 11 to accomplish alignment between the mask and the wafer.

Next, the method of measuring the alignment mark position in the position measuring device 9 will be explained.

FIG. 4 illustrates an example of a conventional alignment mark position measuring method. In regard to FIG. 4, for simplicity of explanation, a case where an alignment mark is provided by a single rectangular pattern will be described. If an alignment mark is provided by plural rectangular patterns, similar operations may be repeated.

In FIG. 4, a registration calculation step S102 is a process for calculating the centricity (degree of registration) of the mark, and repeated calculations are made with respect to a certain mark position measurement range having been preset. For example, as shown in FIG. 5, by repeating the registration calculation step S102 to a mark waveform $S(x)_1$, the registration degree $r(x)_1$ can be determined.

Now, two examples for conventional registration degree calculating processes will be explained.

In a first example, the degree of registration between a mark waveform (detected waveform) and a preset template waveform (reference waveform) is calculated while shifting the template position. The template position where the registration degree becomes highest is taken as the mask position. Hereinafter, this method will be called a "template matching method". The registration degree can be calculated, on the basis of the difference between the mark waveform and the template waveform. The registration degree $r(x)$ at a position x upon the mark waveform can be determined in accordance with equation (1) or equation (2), below.

$$r(x) = \frac{1}{\sum_{k=-w/2}^{w/2} |S(x+k) - T(k)|} \tag{1}$$

$$r(x) = \frac{1}{\sum_{k=-w/2}^{w/2} \{S(x+k) - T(k)\}^2} \quad (2)$$

in equation (1) and (2), S(x) is the mark waveform, T(x) is the template waveform, and w is the waveform width for calculating the registration degree, and it corresponds to the width of the template.

A second example is that a mark waveform is laterally and symmetrically folded at a certain position and the registration degree between the left-hand side and right-hand side mark waveforms is calculated while shifting the folding position. The folding position with which the registration degree becomes highest is taken as the mark central position. Hereinafter, this method will be called a "folding method". The registration degree can be calculated on the basis of a difference between the left-hand and right-hand mark waveforms. The registration degree r(x) at a position x upon the mark waveform can be determined in accordance with equation (3) or equation (4) below.

$$r(x) = \frac{1}{\sum_{k=0}^{w/2} |S(x+k) - S(x-k)|} \quad (3)$$

$$r(x) = \frac{1}{\sum_{k=0}^{w/2} \{S(x+k) - S(x-k)\}^2} \quad (4)$$

A highest registration calculation step S103 in FIG. 4 is a process for determining the highest registration degree position (template position or folding position) as can be calculated by the registration calculation at step S102, such that the thus determined position is taken as the mark center position. The position where the registration degree becomes highest can be determined, at a precision less than the resolving power of a sensor, in accordance with a gravity center calculation to the registration degree at each position x or with a quadratic function approximation, for example. For example, equation (5) below is a method wherein the mark center position $M_C$ is determined through gravity center calculation.

$$M_c = \frac{\sum_{k=ss}^{se} kr(k)}{\sum_{k=ss}^{se} r(k)} \quad (5)$$

In the equation above, a range from "ss" to "se" is the range of registration degree being preset for gravity center calculation.

The description made above concerns the alignment mark position measuring method to be performed with the position measuring means 9. While the foregoing description relates to wafer position measurement, the position measuring method described above is applicable also to mask (reticle) position measurement or any other position measurement for a component or a unit in a semiconductor exposure apparatus such as a stage, for example. Further, it can be applied to relative alignment between a reticle (mask) and a certain reference position in the apparatus, or between any other components of the apparatus.

In alignment marks to be used in a semiconductor exposure apparatus, however, there is non-uniformness in surface level difference of each alignment mark or non-uniformness in film thickness of a photoresist covering the mark. Such non-uniformness causes deformation in shape of a mark waveform to be inputted into an image pickup device, and it in turn causes a measurement error.

If for example, a mark waveform $S(x)_2$ (FIG. 5), having its shape deformed due to non-uniformness of a resist coating or of the surface level difference of the alignment mark, is inputted, then the registration degree $r(x)_2$ also changes, thus causing an error with respect to calculation of the largest registration degree position. Such a measurement error attributable to deformation of the waveform shape may not be so critical conventionally. Since, however, further improvements in alignment precision are required more and more, it is very desirable to reduce the measurement error due to deformation of a waveform shape.

SUMMARY OF THE INVENTION

It is accordingly an object of the present invention to reduce a measurement error due to a change in shape of a mark waveform, caused by any factor such as non-uniformness of a resist coating or of a surface level difference of an alignment mark.

In accordance with an aspect of the present invention, there is provided a position measuring method for measuring a position of a mark formed on an object, said method comprising the steps of: detecting a mark waveform obtainable from the mark; detecting a difference between the detected mark waveform and a reference waveform; correcting at least one of the mark waveform and the reference waveform on the basis of the detected difference; and determining the position of the mark on the basis of the correction.

In one preferred form of this aspect of the present invention, in said correcting step, a parameter for a correction function for determining a correction amount with respect to each position in the waveform is calculated so as to minimize the difference, wherein at least one of the mark waveform and the reference waveform is corrected on the basis of the correction amount as determined by the parameter of the correction function.

In one preferred form of this aspect of the present invention, the reference waveform is based on a template waveform prepared beforehand.

In one preferred form of this aspect of the present invention, the reference waveform is based on one of a left-hand half and a right-hand half of the mark waveform.

In one preferred form of this aspect of the present invention, the parameter of the correction function is calculated in accordance with a least square method.

In one preferred form of this aspect of the present invention, the correction function comprises an equation representing a straight line.

In one preferred form of this aspect of the present invention, in said mark position determining step, a degree of registration between the corrected mark waveform and the reference waveform is calculated, wherein the position of the mark is determined in accordance with a position where the registration degree is highest.

In one preferred form of this aspect of the present invention, the registration degree is calculated on the basis of a correlation coefficient between the corrected mark waveform and the reference waveform.

In accordance with another aspect of the present invention, there is provided a semiconductor exposure apparatus wherein wafer alignment is performed on the basis of detection of a position of an alignment mark formed on a wafer, and wherein a pattern of a reticle is transferred to the wafer, said apparatus comprising: first detecting means for detecting a mark waveform obtainable from the alignment mark; second detecting means for detecting a difference between the detected mark waveform and a reference waveform; correcting means for correcting at least one of the mark waveform and the reference waveform on the basis of the detected difference; and determining means for determining the position of the alignment mark on the basis of the correction.

In one preferred form of this aspect of the present invention, said correcting means is arranged to calculate a parameter for a correction function for determining a correction amount with respect to each position in the waveform so as to minimize the difference, wherein said correcting means corrects at least one of the mark waveform and the reference waveform on the basis of the correction amount as determined by the parameter of the correction function.

In one preferred form of this aspect of the present invention, the reference waveform is based on a template waveform prepared beforehand.

In one preferred form of this aspect of the present invention, the reference waveform is based on one of a left-hand half and a right-hand half of the mark waveform.

In one preferred form of this aspect of the present invention, the parameter of the correction function is calculated in accordance with a least square method.

In one preferred form of this aspect of the present invention, the correction function comprises an equation representing a straight line.

In one preferred form of this aspect of the present invention, said mark position determining means calculates a degree of registration between the corrected mark waveform and the reference waveform, wherein the position of the mark is determined in accordance with a position where the registration degree is highest.

In one preferred form of this aspect of the present invention, the registration degree is calculated on the basis of a correlation coefficient between the corrected mark waveform and the reference waveform.

In accordance with a further aspect of the present invention, there is provided a device manufacturing method which includes an exposure process to be performed by use of a semiconductor exposure apparatus as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

When the present invention is applied to a template matching method, a waveform correction process may be performed as follows. That is, in order that, with respect to each template position, the differences between a mark waveform (detected waveform) and a template waveform (reference waveform) are minimized, the values of one of or both of the mark waveform and the template waveform may be corrected in accordance with a proportion corresponding to each position. After this, a registration degree calculation process is performed.

Correcting the waveform in accordance with the proportion corresponding to each position is important because, in many cases, deformation of a mark waveform due to non-uniformness of a resist coating or of a mark surface level difference changes gradually with the position.

Figure 6:
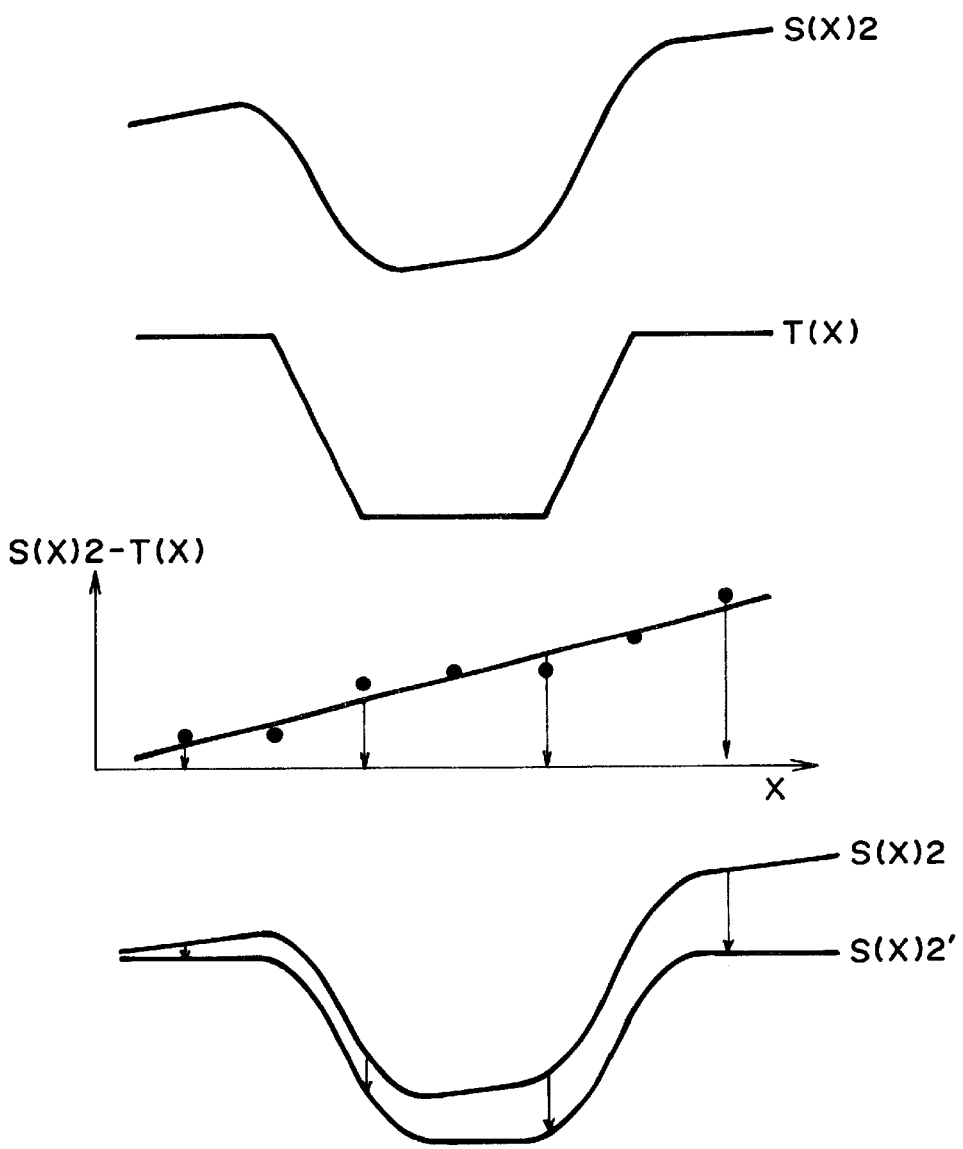
FIG. 6 is a schematic view for explaining a waveform correcting method based on a template matching method.

FIG. 6 illustrates waveform correction. The differences between a mark waveform $S(x)_2$ and a template $T(x)$ may be approximated through a function, with respect to the position x, to create a corrected waveform $S(x)_2'$ with which the difference between the mark waveform and the template waveform may become an approximated error. Namely, the mark waveform $S(x)_2$ may be corrected there by an amount of the approximation function.

When the present invention is applied to a folding method, a waveform correction process may be performed as follows. That is, in order that, with respect to each folding position, the differences between left-hand and right-hand mark waveforms are minimized, the values of one of or both of the left-hand and right-hand portion of the mark waveform may be corrected in accordance with a proportion corresponding to each position. Thereafter, a registration degree calculation process may be performed.

In this folding method, one of the left-hand and right-hand portions of the mark waveform may function as a reference waveform. The differences between the left-hand and right-hand mark waveforms at each position may be approximated through a function, with respect to the position, and the value of one of or both of the left-hand and right-hand portions of the mark waveform may be corrected so that the difference between the left-hand and right-hand mark waveforms may become an approximated error.

As regards the registration degree calculation process to be performed after the waveform correction, in the case of a template matching method, the registration degree may be calculated on the basis of the difference between the mark waveform and the template waveform, whereas in the case of a folding method, it may be calculated on the basis of the difference between the left-hand and right-hand mark waveforms. This is just what has been described hereinbefore. In the present invention, however, a correlation coefficient may be introduced into the registration degree calculation process. It provides an additional advantage that any level difference or a tilt in the mark waveform can be corrected.

While the introduction of a correlation coefficient will cause a small prolongation of calculation time, it produces an advantageous effect that the waveform can be corrected in accordance with a proportion corresponding to each value. Specifically, in the case of a template machine method, the registration degree may be calculated in accordance with a correlation coefficient between the mark waveform and the template waveform. In the case of a folding method, it may be calculated in accordance with a correlation coefficient between the left-hand and right-hand mark waveforms.

By correcting any level difference or tilt of a mark waveform in accordance with a proportion corresponding to respective positions prior to execution of a registration degree calculation process, as described above, a measurement error to be produced by a change in shape of the mark waveform attributable to non-uniformness of a resist coating or of an alignment mark surface level difference, for example, can be reduced significantly.

Position measuring methods and semiconductor exposure apparatuses using the same, which are going to be described below with reference to some preferred embodiments of the present invention, may have a basic structure similar to that of the semiconductor exposure apparatus having been described hereinbefore. Therefore, in the following description, the structure of each semiconductor exposure apparatus as well as a process for aligning a mask and a wafer in each semiconductor exposure apparatus will not be explained to avoid duplication. A description will be made mainly with respect to the position measurement of an alignment mark in a semiconductor exposure apparatus.

Figure 1:
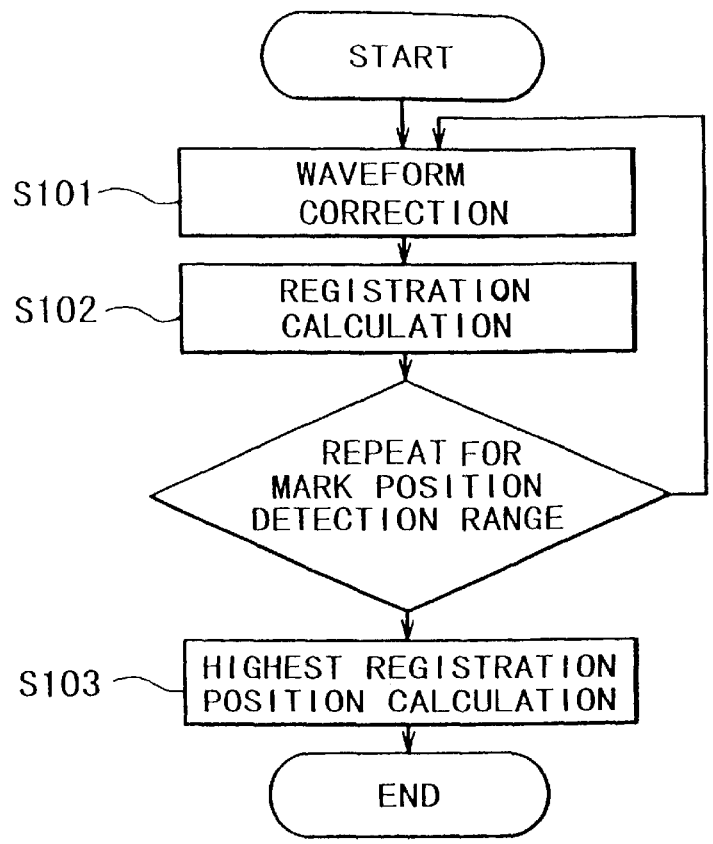
FIG. 1 is a schematic view for explaining an alignment mark position measuring method according to an embodiment of the present invention.
Figure 2:
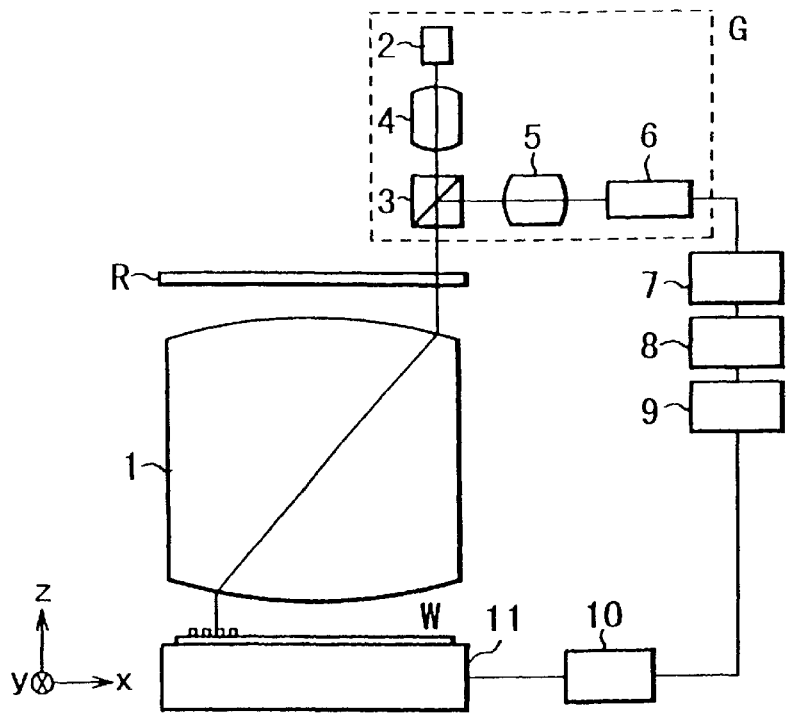
FIG. 2 is a schematic view of a semiconductor exposure apparatus to which the present invention is applicable.
Figure 3A:
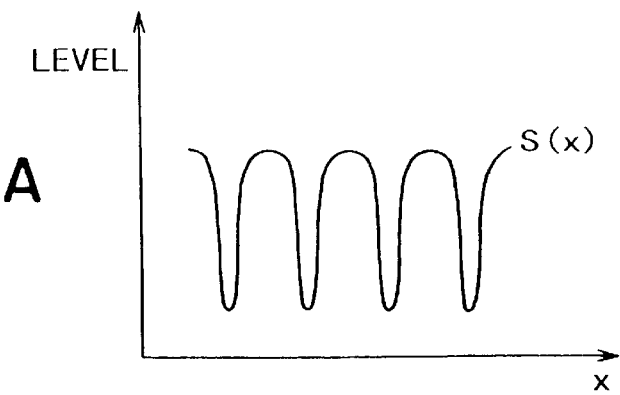
FIGS. 3A and 3B are schematic views, respectively, for explaining an alignment mark.
Figure 3B:
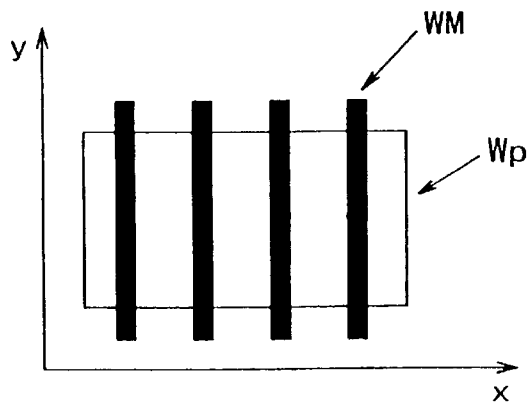
Figure 4:
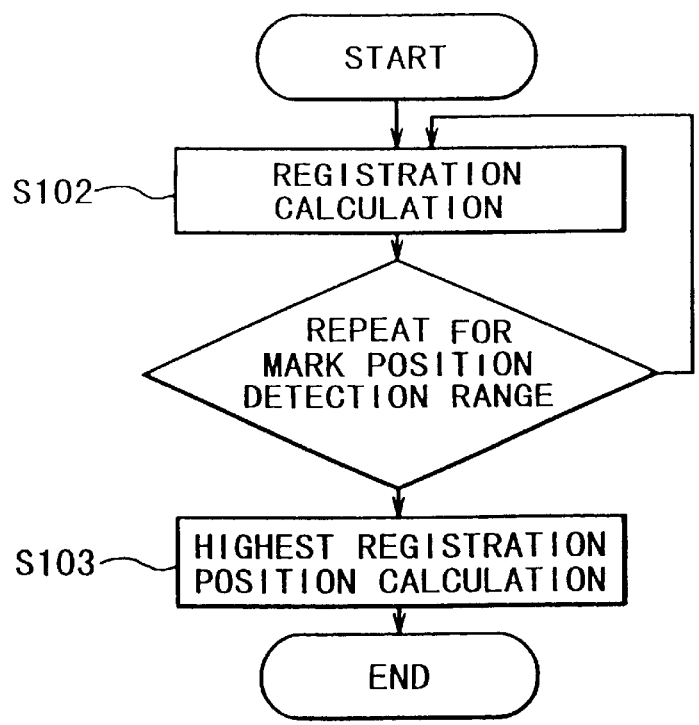
FIG. 4 is a schematic view for explaining an example of a conventional alignment mark position measuring method.
Figure 5:
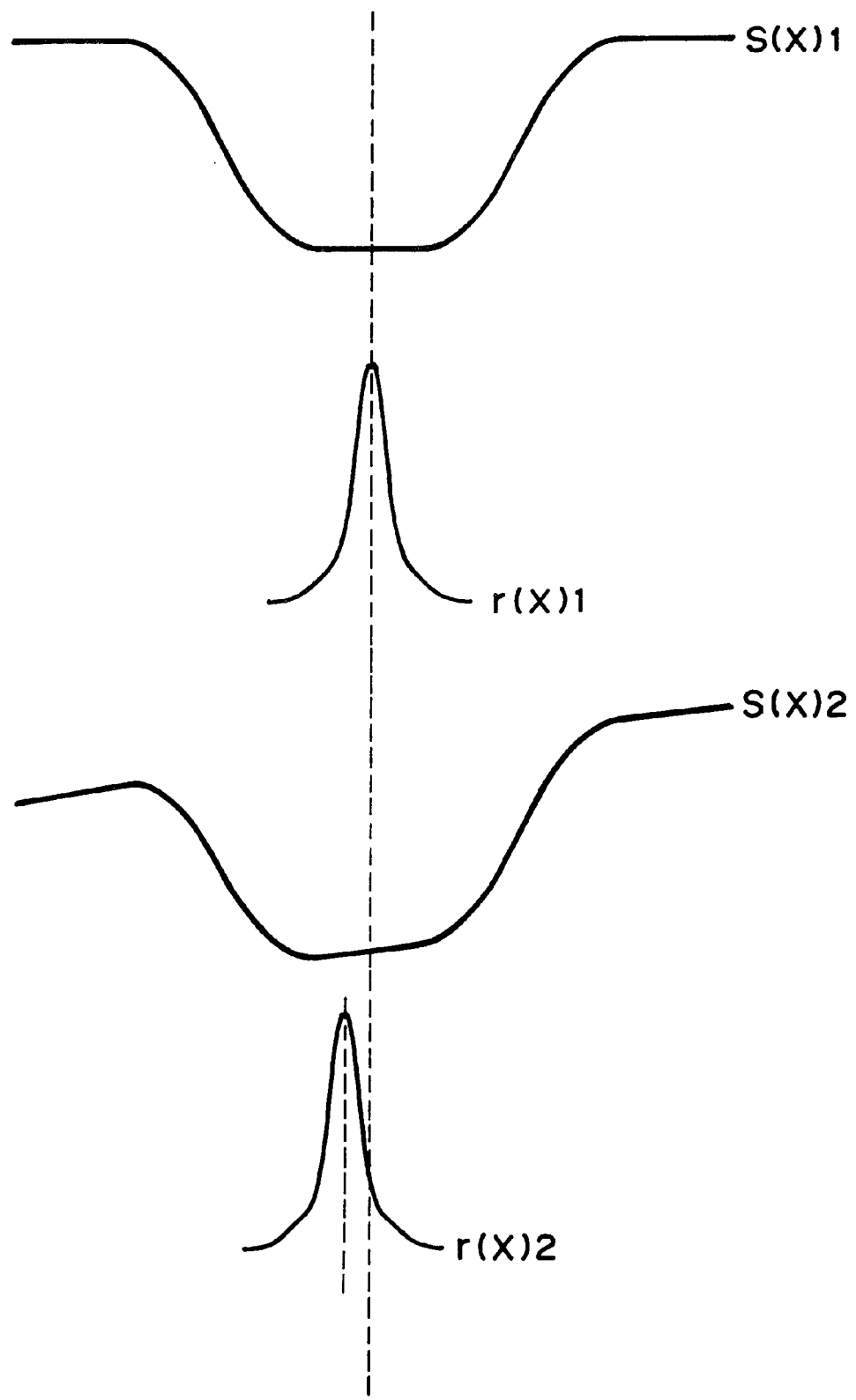
FIG. 5 is a schematic view for explaining examples of mark waveforms.

Referring to FIG. 1, a first embodiment of the present invention wherein a template matching method is used for alignment mark position measurement will be described.

In FIG. 1, a waveform correction process at step S101 is a process wherein, in order that, with respect to each template position, differences between a mark waveform and a template waveform are minimized, the values of one of or both of the mark waveform and the template waveform are corrected in accordance with a proportion corresponding to each position. For example, differences between the mark waveform and the template waveform at each position may be approximated by using a preset error function and in accordance with a least square approximation method, for example, to each position, and values of one of or both of the mark waveform and the template waveform may be corrected so that the difference between the mark waveform and the template waveform may become an approximated error.

Figure 7:
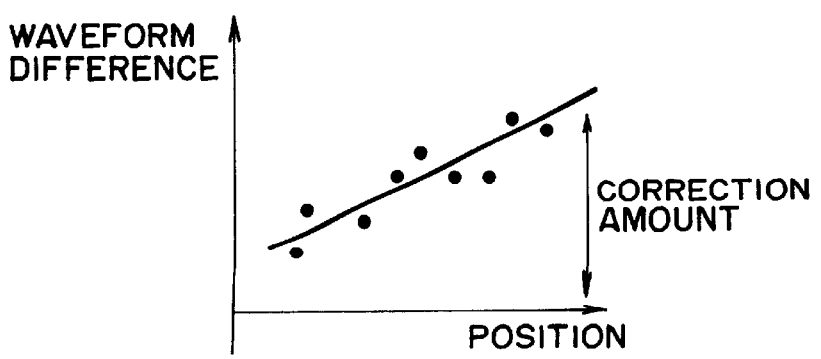
FIG. 7 is a schematic view for explaining another waveform correcting method.

FIG. 7 is a graph for explaining a correction method wherein differences between a mark waveform and a template waveform are approximated along a straight line, at each position. In FIG. 7, the differences between the mark waveform and the template waveform are taken on the axis of the ordinate, while the positions are taken on the axis of the abscissa. It is seen that the differences between the mark waveform and the template waveform are in a distribution that can be approximated to a straight line.

$$y = Ax + B \quad (6)$$

By using a least square method, the coefficients A and B of the straight line can be determined in accordance with the following equations.

$$A = \frac{\sum_{k=-w}^{w}\{kD(k)\}\sum_{k=-w}^{w}\{k\} - \sum_{k=-w}^{w}\{k^2\}\sum_{k=-w}^{w}\{D(k)\}}{\sum_{k=-w}^{w}\{k\}\sum_{k=-w}^{w}\{k\} - \sum_{k=-w}^{w}\{k\}\sum_{k=-w}^{w}\{k^2\}} \quad (7)$$

$$B = \frac{\sum_{k=-w}^{w}\{k\}\sum_{k=-w}^{w}\{D(k)\} - \sum_{k=-w}^{w}\{1\}\sum_{k=-w}^{w}\{kD(k)\}}{\sum_{k=-w}^{w}\{k\}\sum_{k=-w}^{w}\{k\} - \sum_{k=-w}^{w}\{k\}\sum_{k=-w}^{w}\{k^2\}} \quad (8)$$

where $D(k)$ is the difference between the mark waveform and the template waveform at each position x, and it can be expressed as follows.

$$D(k) = S(x+k) - T(k) \quad (9)$$

In this embodiment, for correction of the differences between the mark waveform and the template waveform, the mark waveform is corrected so that the differences between the mark waveform and the template waveform may become errors as approximated by equation (6). More specifically, when, at each position x, a corrected mark waveform as can be provided by subtracting a value of the approximation straight line from the value of the mark wavelength is $S(x)'$, an equation for calculating $S(x)'$ is provided by:

$$S(x+k)' = S(x+k) - \{Ak + B\} \quad (10)$$

Equation (10) above is a simple example for approximating differences between a mark waveform and a template waveform along a straight line. Depending on the state of changes in the shape of a mark waveform, the approximation may be done by use of any other function such as a quadratic function or a trigonometric function, for example. Further, while equation (10) above concerns an example wherein the values of a mark waveform are corrected, a template waveform may be corrected in place of it or, alternatively, correction may be made to both of the mark waveform and the template waveform, by half and half.

After completion of the correction, in a registration degree calculation process at step S102, within a certain mark position measurement range having been preset in regard to the mark waveform $(S(x)')$, the centrality (degree of registration) is calculated repeatedly, and changes in registration degree $r(x)$ are calculated.

Step S103 in FIG. 1 is a highest registration degree position calculation process. Conventionally, as described hereinbefore, the registration degree is calculated from the difference between a mark waveform and a template waveform. In this embodiment, it is based on a mark waveform and a template waveform at least one of which has been corrected. Further, in the present invention, a correlation coefficient between a mark waveform and a template waveform, such as described below, may be introduced to calculate the registration degree $r(x)$.

$$r(x) = \frac{\sum_{k=-w}^{w} [\{S(x+k) - S_{ave}(x)\}\{T(k) - T_{ave}(x)\}]}{\sqrt{\sum_{k=0}^{w} \{S(x+k) - S_{ave}(x)\}^2} \sqrt{\sum_{k=0}^{w} \{T(k) - T_{ave}(x)\}^2}} \quad (11)$$

wherein $S_{ave}(x)$ and $T_{ave}(x)$ are averages of a mark waveform and of a template waveform which can be expressed by equation (12) and (13) below.

$$S_{ave}(x) = \frac{\sum_{k=-w}^{w} \{S(x+k)\}}{2w+1} \quad (12)$$

$$T_{ave}(x) = \frac{\sum_{k=-w}^{w} \{T(k)\}}{2w+1} \quad (13)$$

Calculating the registration degree on the basis of a correlation coefficient will cause a small prolongation of calculation time. However, it has an advantageous effect that the waveform can be corrected in accordance with a proportion corresponding to each value. Thus, a more effective correction is attainable.

What has been described just above is the principle of an alignment mark position measuring method according to the first embodiment. This embodiment is applicable to wafer position measurement and also to wafer-to-reticle alignment. However, the embodiment is applicable also to position measurement for a reticle or any other component or unit in a semiconductor exposure apparatus. Thus, the position measuring method of this embodiment can be applied to relative alignment between a reticle (mask) and a certain reference position in an apparatus or between components of an apparatus, for example.

Next, an alignment mark measuring method according to a second embodiment of the present invention will be explained, again with reference to FIG. 1. In this embodiment, a folding method is used.

Step S101 in FIG. 1 is a waveform correction process wherein, in this embodiment, in order that, with respect to each waveform folding position, differences between a left-hand portion and a right-hand portion of a mark waveform are minimized, the values of one of or both of the left-hand and right-hand portions of the mark waveform are corrected in accordance with a proportion corresponding to each position. Namely, in the folding method used, either the left-hand portion of or the right-hand portion of the mark waveform functions as a reference waveform. The differences between the left-hand and right-hand mark waveforms may be approximated, with respect to each position, by using a predetermined error function, and the values of one of or both of the left-hand and right-hand portions of the mark waveform may be corrected so that the differences between them may become differences as approximated by a function.

FIG. 7 is a graph for explaining a correction method wherein, in this embodiment, differences between a left-hand portion and a right-hand portion of a mark waveform are approximated, along a straight line, at each position. In FIG. 7, the differences between the left-hand and right-hand portions of the mark waveform are taken on the axis of the ordinate, while the positions are taken on the axis of the abscissa. It is seen that the differences between the left-hand and right-hand portions of the waveform are in a distribution that can be approximated to a straight line.

In this embodiment, the distribution shown in FIG. 7 is approximated by a straight line:

$$y = Ax + B \quad (14)$$

By using a least square method, the coefficients A and B of the straight line can be determined in accordance with the following equations.

$$A = \frac{\sum_{k=-w}^{w} \{kD(k)\} \sum_{k=-w}^{w} \{k\} - \sum_{k=-w}^{w} \{k^2\} \sum_{k=-w}^{w} \{D(k)\}}{\sum_{k=-w}^{w} \{k\} \sum_{k=-w}^{w} \{k\} - \sum_{k=-w}^{w} \{k\} \sum_{k=-w}^{w} \{k^2\}} \quad (15)$$

$$B = \frac{\sum_{k=-w}^{w} \{k\} \sum_{k=-w}^{w} \{D(k)\} - \sum_{k=-w}^{w} \{1\} \sum_{k=-w}^{w} \{kD(k)\}}{\sum_{k=-w}^{w} \{k\} \sum_{k=-w}^{w} \{k\} - \sum_{k=-w}^{w} \{k\} \sum_{k=-w}^{w} \{k^2\}} \quad (16)$$

where $D(k)$ is the difference between the left-hand and right-hand portion of the mark waveform at each position x, and it can be expressed as follows.

$$D(k) = S(x-k) - S(x+k) \quad (17)$$

In this embodiment, for correction of the differences between the left-hand and right-hand portions of the mark waveform, the mark waveform is corrected so that the differences between them may become errors as approximated by equation (14). More specifically, if, at each position x, a corrected mark waveform as can be provided by subtracting a value of the approximation straight line from the value of the left-hand portion of the mark wavelength of $S(x)'$, an equation for calculating $S(x)'$ can be expressed as follows (here, the following correction will be made only to the left-hand portion of the mark waveform).

$$S(x+k)' = S(x+k) - \{Ak + B\} \quad (18)$$

Equation (18) above is a simple example for approximating differences between a left-hand portion and a right-hand portion of a mark waveform along a straight line. Depending on the state of changes in the shape of a mark waveform, the approximation may be done by use of any other function such as a quadratic function or a trigonometric function, for example.

Further, while equation (18) above concerns an example wherein the values of a left-hand mark waveform are corrected, a right-hand mark waveform may be corrected in place of it or, alternately, correction may be made to both of the left-hand and right-hand mark waveforms, by half and half.

After completion of the correction, in a registration degree calculation process at step S102, within a certain mark position measurement range having been preset in regard to the mark waveform $S(x)'$, the centrality (degree of registration) is calculated repeatedly, and changes in registration degree $r(x)$ are calculated.

Step S102 in FIG. 1 is a highest registration degree position calculation process, like that of the first embodiment. A correlation coefficient between a mark waveform and a template waveform may be introduced to calculate the registration degree, like the first embodiment, and a further enhancement of precision is attainable on that occasion.

What has been described just above is the principle of an alignment mark position measuring method according to the second embodiment.

Like the first embodiment, the second embodiment is applicable to wafer position measurement and also to wafer-to reticle alignment. Further, the embodiment is applicable also to position measurement for a reticle or any other component or unit in a semiconductor exposure apparatus. Thus, the position measuring method of this embodiment can be applied to relative alignment between a reticle (mask) and a certain reference position in an apparatus or between components of an apparatus, for example.

As described above, in a position measuring method and a semiconductor exposure apparatus using the same, according to a preferred embodiment of the present invention, for measurement of a position of an alignment mark, one of or both of a mark detection waveform and a reference waveform are corrected in accordance with a difference between the mark detection waveform and the reference waveform. With this correction, a measurement error to be produced by a change in shape of the mark waveform attributable to non-uniformness of a resist coating or of an alignment mark surface level difference, for example, can be reduced effectively. Thus, the alignment precision can be improved significantly. This is very effective to increase the semiconductor manufacture yield and to enable large integration of the device.

A correlation processing may be added to the mark waveform processing. It enables further enhancement of precision, and contributes to improvement of alignment precision.

Next, an embodiment of a semiconductor device manufacturing method which uses a semiconductor exposure apparatus based on a position measuring method such as described above, will be explained.

Figure 8:
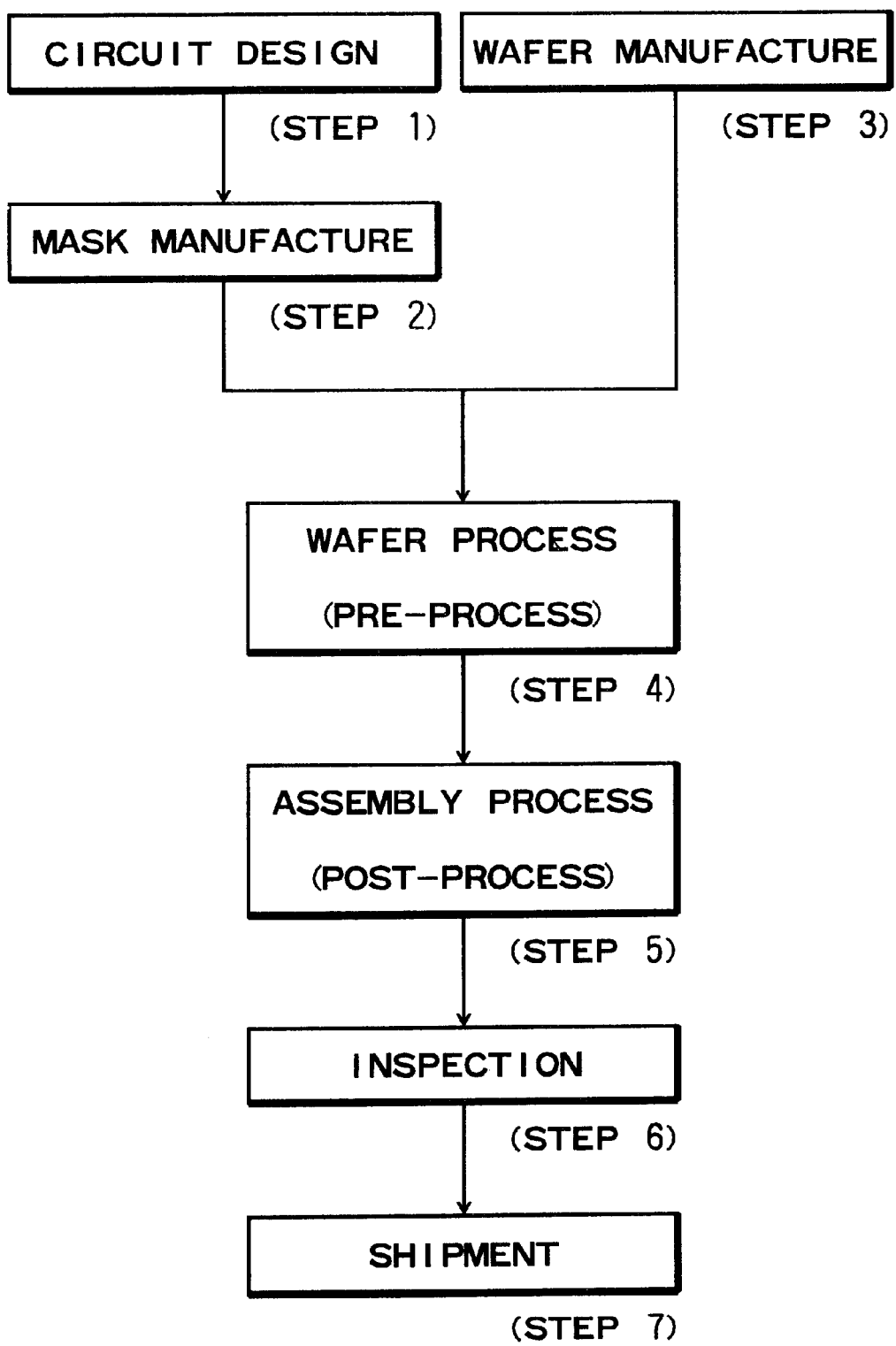
FIG. 8 is a flow chart of semiconductor device manufacturing processes.

FIG. 8 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
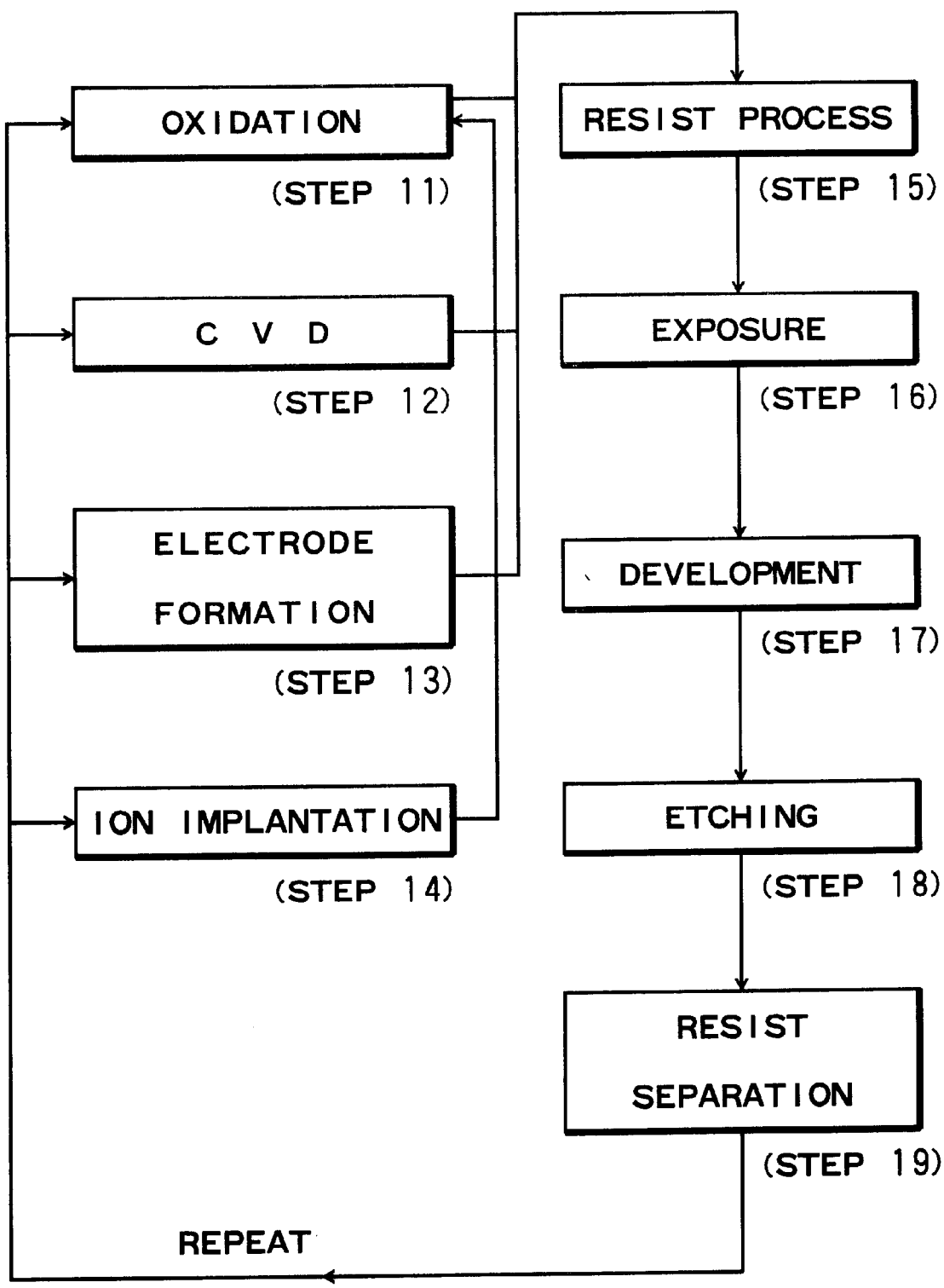
FIG. 9 is a flow chart for explaining details of a wafer process.

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A position measuring method for measuring a position of a mark formed on an object, said method comprising the steps of:

detecting a mark waveform obtainable from the mark;

acquiring a difference between the detected mark waveform and a reference waveform;

correcting at least one of the mark waveform and the reference waveform on the basis of the acquired difference; and determining the position of the mark on the basis of (i) the corrected mark waveform and the reference waveform, (ii) the mark waveform and the corrected reference waveform, or (iii) the corrected waveform and the corrected reference waveform.

2. A method according to claim 1, wherein, in said correcting step, a parameter for a correction function for determining a correction amount with respect to each position in the mark waveform or the reference waveform is calculated so as to minimize the difference between the mark waveform and the reference waveform, and wherein at least one of the mark waveform and the reference waveform is corrected on the basis of the correction amount as determined by the parameter of the correction function.

3. A method according to claim 2, wherein the parameter of the correction function is calculated in accordance with a least square method.

4. A method according to claim 2, wherein the correction function comprises an equation representing a straight line.

5. A method according to claim 1, wherein, in said mark position determining step, a degree of registration between the corrected mark waveform and the reference waveform is calculated, and the position of the mark is determined in accordance with a position at which the registration degree is highest.

6. A method according to claim 5, wherein the registration degree is calculated on the basis of a correlation coefficient between the corrected mark waveform and the reference waveform.

7. A semiconductor exposure apparatus wherein wafer alignment is performed on the basis of detection of a position of an alignment mark formed on a wafer, and a pattern of a reticle is transferred to the wafer, said apparatus comprising:

detecting means for detecting a mark waveform obtainable form the alignment mark;

acquiring means for acquiring a difference between the detected mark waveform and a reference waveform;

correcting means for correcting at least one of the mark waveform and the reference waveform on the basis of the acquired difference; and determining means for determining the position of the alignment mark on the basis of (i) the corrected mark waveform and the reference waveform, (ii) the mark waveform and the corrected reference waveform, or (iii) the corrected waveform and the corrected reference waveform.

8. An apparatus according to claim 7, wherein said correcting means is arranged to calculate a parameter for a correction function for determining a correction amount with respect to each position in the mark waveform or the reference waveform so as to minimize the difference between the mark waveform and the reference waveform, and wherein said correcting means corrects at least one of the mark waveform and the reference waveform on the basis of the correction amount as determined by the parameter of the correction functions.

9. An apparatus according to claim 8, wherein the parameter of the correction function is calculated in accordance with a least square method.

10. An apparatus according to claim 8, wherein the correction function comprises an equation representing a straight line.

11. An apparatus according to claim 8, wherein said mark position determining means calculates a degree of registration between the corrected mark waveform and the reference waveform, and wherein the position of the mark is determined in accordance with a position where the registration degree is highest.

12. An apparatus according to claim 11, wherein the registration degree is calculated on the basis of a correlation coefficient between the corrected mark waveform and the reference waveform.

13. A position measuring method for measuring a position of a mark formed on an object, said method comprising the steps of:
   detecting a mark waveform obtainable from the mark;
   acquiring a difference between the detected mark waveform and a template waveform prepared beforehand;
   correcting at least one of the mark waveform and the template waveform on the basis of the acquired difference; and
   determining the position of the mark on the basis of (i) the corrected mark waveform and the template waveform, (ii) the mark waveform and the corrected template waveform, or (iii) the corrected mark waveform and the corrected template waveform.

14. A position measuring method for measuring a position of a mark formed on an object, said method comprising the steps of:
   detecting a mark waveform obtainable from the mark;
   acquiring a difference between a left-hand half and a right-hand half of the detected mark waveform;
   correcting at least one of the left-hand and right-hand halves of the detected mark waveform on the basis of the acquired difference; and
   determining the position of the mark on the basis of the corrected mark waveform.

15. A position measuring apparatus for measuring a position of a mark formed on an object, said apparatus comprising:
   detecting means for detecting a mark waveform obtainable from the mark;
   acquiring means for acquiring a difference between the detected mark waveform and a template waveform prepared beforehand;
   correcting means for correcting at least one of the mark waveform and the template waveform on the basis of the acquired difference; and
   determining means for determining the position of the mark on the basis of (i) the corrected mark waveform and the template waveform, (ii) the mark waveform and the corrected template waveform, or (iii) the corrected mark waveform and the corrected template waveform.

16. A position measuring apparatus for measuring a position of a mark formed on an object, said apparatus comprising:
   detecting means for detecting a mark waveform obtainable from the mark;
   acquiring means for acquiring a difference between a left-hand half and a right-hand half of the detected mark waveform;
   correcting means for correcting at least one of the left-hand and right-hand halves of the detected mark waveform on the basis of the acquired difference; and
   determining means for determining the position of the mark on the basis of the corrected mark waveform.

17. A device manufacturing method, comprising the steps of:
   detecting a mark waveform obtainable from an alignment mark formed on a wafer;
   acquiring a difference between the detected mark waveform and a reference waveform;
   correcting at least one of the mark waveform and the reference waveform on the basis of the acquired difference;
   determining the position of the alignment mark on the basis of (i) the corrected mark waveform and the reference waveform, (ii) the mark waveform and the corrected reference waveform, or (iii) the corrected mark waveform and the corrected reference waveform;
   aligning the wafer on the basis of the determined position of the alignment mark; and
   transferring a pattern formed on a reticle, onto a wafer.

18. A position measuring method for measuring a position of a mark formed on an object, said method comprising the steps of:
   detecting a mark waveform obtainable from the mark;
   detecting a difference between the detected mark waveform and a reference waveform, wherein the reference waveform is based on one of a left-hand half and a right-hand half of the mark waveform;
   correcting at least one of the mark waveform and the reference waveform on the basis of the detected difference; and
   determining the position of the mark on the basis of the correction.

19. A position measuring method for measuring a position of a mark formed on an object, said method comprising the steps of:
   detecting a mark waveform obtainable from the mark;
   detecting a difference between the detected mark waveform and a reference waveform;
   correcting at least one of the mark waveform and the reference waveform on the basis of the detected difference; and
   determining the position of the mark on the basis of the correction, wherein, in said determining step, a degree of registration between the corrected mark waveform and the reference waveform is calculated, and the position of the mark is determined in accordance with a position where the registration degree is highest, wherein the registration degree is calculated on the basis of a correlation coefficient between the corrected mark waveform and the reference waveform.

20. A semiconductor exposure apparatus wherein wafer alignment is performed on the basis of detection of a position of an alignment mark formed on a wafer, and a pattern of a reticle is transferred to the wafer, said apparatus comprising:

first detecting means for detecting a mark waveform obtainable form the alignment mark;

second detecting means for detecting a difference between the detected mark waveform and a reference waveform, wherein the reference waveform is based on one of a left-hand half and a right-hand of the mark waveform;

correcting means for correcting at least one of the mark waveform and the reference waveform on the basis of the detected difference; and determining means for determining the position of the alignment mark on the basis of the correction.

21. A semiconductor exposure apparatus wherein wafer alignment is performed on the basis of detection of a position of an alignment mark formed on a wafer, and a pattern of a reticle is transferred to the wafer, said apparatus comprising:

first detecting means for detecting a mark waveform obtainable form the alignment mark;

second detecting means for detecting a difference between the detected mark waveform and a reference waveform;

correcting means for correcting at least one of the mark waveform and the reference waveform on the basis of the detected difference; and determining means for determining the position of the alignment mark on the basis of the correction, wherein said determining means calculates a degree of registration between the corrected mark waveform and the reference waveform, and the position of the mark is determined in accordance with a position where the registration degree is highest, wherein the registration degree is calculated on the basis of a correlation coefficient between the corrected mark waveform and the reference waveform.

* * * * *

UNITED STATES PATENT AND TRADEMARK OFFICE
CERTIFICATE OF CORRECTION

PATENT NO. : 6,538,260 B1
DATED : March 25, 2003
INVENTOR(S) : Shinichiro Koga

It is certified that error appears in the above-identified patent and that said Letters Patent is hereby corrected as shown below:

Column 3,
Line 7, "in equation" should read -- In equations --.

Column 4,
Line 6, "If" should read -- If, --.

Column 7,
Line 3, "machine" should read -- matching --.
Line 60, "line." should read -- line.
            In this embodiment, the distribution shown in Figure 7 is approximated by a straight line: --.

Column 8,
Line 53, "$(Scx)^1$," should read -- $S(x)^1$, --.

Column 10,
Line 34, "wavelength of" should read -- wavelength is --.

Column 11,
Line 3, "to reticle" should read -- to-reticle --.

Signed and Sealed this

Thirtieth Day of December, 2003

JAMES E. ROGAN
*Director of the United States Patent and Trademark Office*